United States Patent
Ha et al.

(10) Patent No.: US 10,746,779 B2
(45) Date of Patent: Aug. 18, 2020

(54) FAULT LOCATION DETECTION AND DISTANCE PROTECTION APPARATUS AND ASSOCIATED METHOD

(71) Applicant: General Electric Technology GmbH, Baden (CH)

(72) Inventors: Hengxu Ha, Stafford (GB); Sankara Subramanian Sri Gopala Krishna Murthi, Stafford (GB)

(73) Assignee: General Electric Technology GmbH, Baden (CH)

( * ) Notice: Subject to any disclaimer, the term of this patent is extended or adjusted under 35 U.S.C. 154(b) by 121 days.

(21) Appl. No.: 15/570,612

(22) PCT Filed: Apr. 28, 2016

(86) PCT No.: PCT/EP2016/059555
§ 371 (c)(1),
(2) Date: Oct. 30, 2017

(87) PCT Pub. No.: WO2016/174168
PCT Pub. Date: Nov. 3, 2016

(65) Prior Publication Data
US 2018/0284180 A1    Oct. 4, 2018

(30) Foreign Application Priority Data
Apr. 30, 2015  (EP) .................. 15275126

(51) Int. Cl.
*G01R 31/08* (2020.01)
*H02H 3/40* (2006.01)
(Continued)

(52) U.S. Cl.
CPC ......... *G01R 31/088* (2013.01); *G01R 31/085* (2013.01); *H02H 3/405* (2013.01);
(Continued)

(58) Field of Classification Search
CPC .... G01R 31/088; G01R 31/085; H02H 3/042; H02H 7/26; H02H 1/0092; H02H 1/0007
See application file for complete search history.

(56) References Cited

U.S. PATENT DOCUMENTS

| | | | | |
|---|---|---|---|---|
| 5,446,387 A | * | 8/1995 | Eriksson | G01R 31/085 324/522 |
| 2014/0336959 A1 | * | 11/2014 | Thomas | G01R 31/08 702/59 |
| 2018/0034258 A1 | * | 2/2018 | Schweitzer, III | H02H 7/265 |

FOREIGN PATENT DOCUMENTS

| | | |
|---|---|---|
| EP | 0 577 229 B1 | 1/1994 |
| EP | 0 671 011 B1 | 11/2001 |

OTHER PUBLICATIONS

Elhaffar, "Power Transmission Line Fault Location Based on Current Traveling Waves," Doctoral Dissertation, TKK Dissertations 107, pp. 1-141, (2008).

(Continued)

*Primary Examiner* — Regis J Betsch
*Assistant Examiner* — Jeremy A Delozier
(74) *Attorney, Agent, or Firm* — Eversheds Sutherland (US) LLP

(57) ABSTRACT

An apparatus for determining a fault location distance or distance protection in a multi-phase power transmission medium, configured to; determine a set of line fault parameters based on a measurement of voltage and current at a point of said power transmission medium and a fault type, the line fault parameters determined at a plurality of sample times determine a derivative with respect to time of a line fault parameters representative of an inductive part of measured faulty phase current; determine a set of phasors using a Fourier transformation of the derivative and of the remaining line fault parameters at the plurality of sample times and (Continued)

use said set of phasors to determine a fault location distance or distance projection distance along the power transmission medium; wherein, the determination of the fault location distance or the distance protection distance is based on the line equation;

$$\dot{U}_P = \dot{U}_F + \left[R_1 \dot{I}_{PR} + \frac{X_1}{\omega_0} \dot{I}_{PX}\right] D_F.$$

14 Claims, 2 Drawing Sheets

(51) Int. Cl.
    *H02H 3/04*     (2006.01)
    *H02H 1/00*     (2006.01)
    *H02H 7/26*     (2006.01)

(52) U.S. Cl.
    CPC ......... *H02H 1/0007* (2013.01); *H02H 1/0092* (2013.01); *H02H 3/042* (2013.01); *H02H 7/26* (2013.01)

(56) References Cited

OTHER PUBLICATIONS

Extended Search and Opinion issued in connection with corresponding EP Application No. 15275126.9 dated Oct. 7, 2015.
International Search Report and Written Opinion issued in connection with corresponding PCT Application No. PCT/EP2016/059555 dated Aug. 11, 2016.

\* cited by examiner

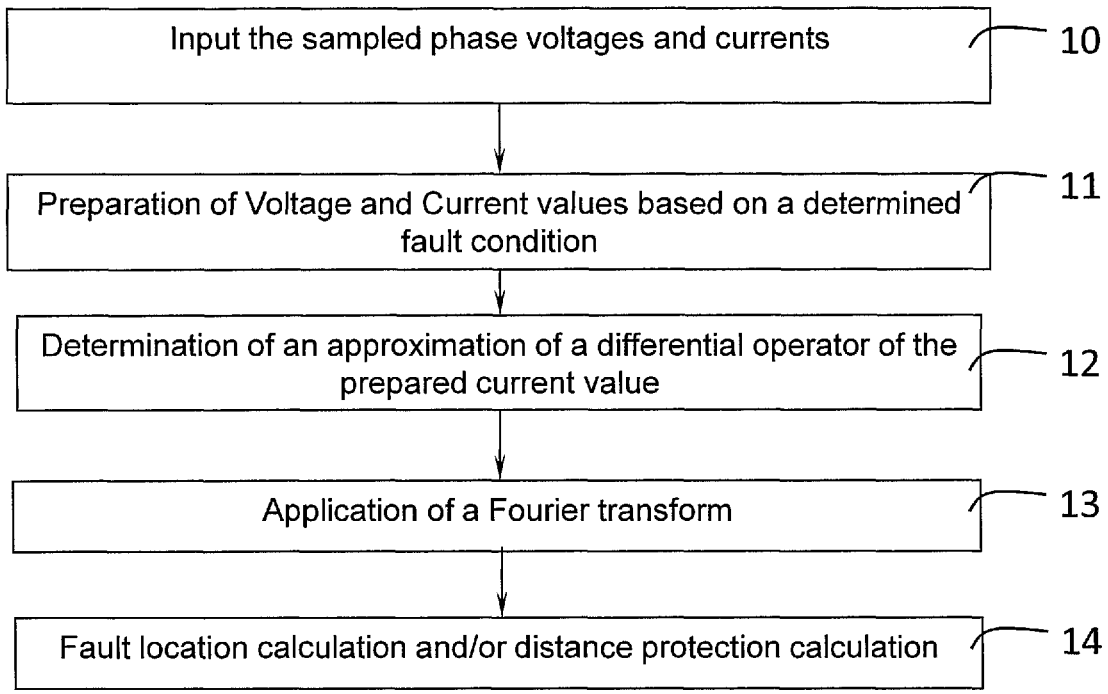
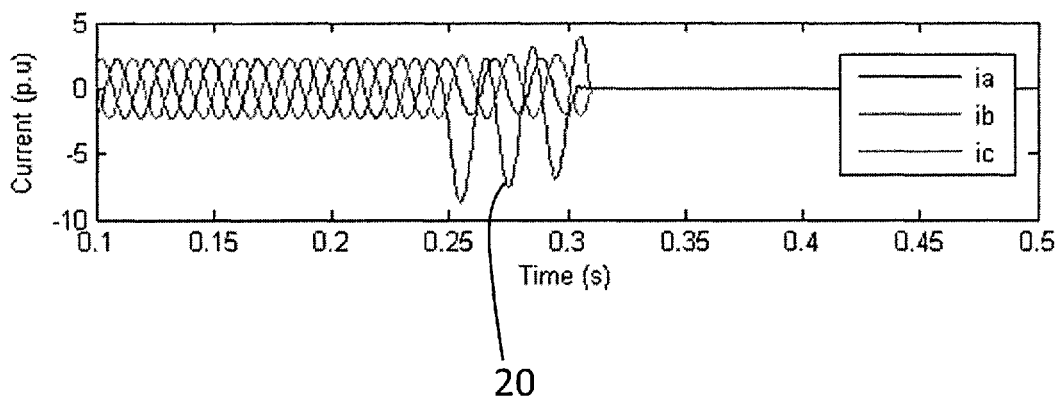

FAULT LOCATION DETECTION AND DISTANCE PROTECTION APPARATUS AND ASSOCIATED METHOD

BACKGROUND OF THE INVENTION

Embodiments of the invention relate to an apparatus for fault detection and/or distance protection. Embodiments of the invention also relate to an associated method and a power transmission network including the apparatus.

BRIEF DESCRIPTION OF THE INVENTION

According to a first aspect of the invention we provide an apparatus for determining a fault location distance or a distance for distance protection in a multi-phase power transmission medium, the apparatus configured to;

determine a set of line fault parameters $u_p$, $i_{PR}$, $i_{PX}$ and $i_{P0}$ based on a measurement sample of voltage and current values at a measurement point for phases of a multi-phase current of said power transmission medium and a fault type, the set of line fault parameters determined at a plurality of sample times, n;

determine a derivative with respect to time of one of the line fault parameters $i_{PX}$ representative of an inductive part of measured faulty phase current;

determine a set of phasors $\dot{U}_P(n)$, $\dot{I}_{PR}(n)$, $\dot{I}_{PX}(n)$, and $\dot{I}_{P0}(n)$ using a Fourier transformation of the derivative and of the remaining line fault parameters at the plurality of sample times and use said set of phasors to determine a fault location distance or distance projection distance along the power transmission medium;

wherein, the determination of the fault location distance or the distance protection distance is based on the line equation;

$$\dot{U}_P = \dot{U}_F + \left[R_1 \dot{I}_{PR} + \frac{X_1}{\omega_0} \dot{I}_{PX}\right] D_F$$

where $\dot{U}_P$, $\dot{I}_{PR}$, and $\dot{I}_{PX}$ comprise the Fourier transforms of the line fault parameters $u_p$, $i_{PR}$ and the derivative $i_{PX}$, $\dot{U}_F$ is a Fourier transform of the voltage at the fault location, $R_1$ is a positive sequence resistance of the power transmission medium per length (ohm/km), $D_F$ is the fault location distance, $X_1$ is a positive sequence reactance of the power transmission medium per length (ohm/km) and $\omega_0$ is the fundamental angular frequency where $\omega_0 = 2\pi f_0$ and $f_0$ is the fundamental frequency of the current of the power transmission medium.

The apparatus may be advantageous as it may provide for accurate determination of a fault location distance and/or a distance protection distance using easy to measure line fault parameters and by use of a derivative of one of them, as well as other advantages.

The set of line fault parameters may comprise measurements of the voltage and currents of at least the faulty phase. $u_p$ may comprise a measurement of the voltage of the faulty phase or a voltage difference between measurements of the voltage for two phases having a phase to phase fault. $i_{PR}$ may comprise a resistive measurement of current of the faulty phase or a difference between current measurements of two phases having a phase to phase fault. $i_{PX}$ may comprise an inductive measurement of current of the faulty phase or a difference between current measurements of two phases having a phase to phase fault. $i_{P0}$ may comprise a residual current measurement, comprising the summation of all (commonly three) phase currents.

The fault type may be provided to the apparatus by a fault type detector configured to detect and identify phases of the power transmission medium experiencing a fault.

Optionally the apparatus is configured to;
determine a fault location distance for one or more of the following fault conditions or for distance protection;
i) a phase-to-phase fault in which:

$$D_F = \frac{imag[\dot{U}_P]}{imag\left[R_1 \dot{I}_{PR} + \frac{X_1}{\omega_0} \dot{I}_{PX}\right]}$$

where the function imag[y] defines taking the imaginary part of the term y;

ii) single-phase-to-ground fault in which;

$$D_F = \frac{imag[\dot{U}_P \overline{I}_{P0}]}{imag\left[\left(R_1 \dot{I}_{PR} + \frac{X_1}{\omega_0} \dot{I}_{PX}\right)\overline{I}_{P0}\right]}$$

where $\overline{I}_{P0}$ is the conjugate of $\dot{I}_{P0}$; and iii) distance protection, in which;

$$\dot{U}_{op} = \dot{U}_P - \left[R_1 \dot{I}_{PR} + \frac{X_1}{\omega_0} \dot{I}_{PX}\right] D_{set}$$

where $D_{set}$ is a setting distance for distance protection and $\dot{U}_{op}$ is a Fourier transform of an operating voltage. Further, if this operating voltage meets the following criterion, then the trip signal of distance protection will be picked up, that is, the fault is determined as an internal fault.

$$90^0 < \arg\frac{\dot{U}_P}{\dot{U}_{op}} < 270^0$$

Optionally, the apparatus is configured to determine a fault location distance for one or more of the following fault types;
a first phase of a multi-phase to ground fault;
a second phase of a multi-phase to ground fault;
a third phase of a multi-phase to ground fault;
a first phase to second phase fault;
a second phase to third phase fault;
a third phase to first phase fault;
a first phase to second phase to ground fault;
a second phase to third phase to ground fault;
a third phase to first phase to ground fault;
a three phase fault of a three phase power transmission medium.

Optionally, the apparatus is configured to determine an approximation of the derivative, with respect to time, of the line fault parameter $i_{PX}$.

Optionally, the apparatus is configured to determine the Fourier transforms based on;
the approximation of the derivative of $i_{PX}$ with respect to time at a sample time n; and the remaining line fault parameters $u_P$, $i_{PR}$ and $i_{P0}$ at a sample time delayed relative to n, the delay based in the approximation.

Optionally, the apparatus is configured to determine an approximation of said derivative with respect to time of one of the line parameters $i_{PX}$ wherein the approximation is made using a number M of sample sets n by;

$$i_{PXDer}(n) = \frac{1}{T_s} \sum_{k=0}^{M} h(k) i_{PX}(n-k)$$

where $i_{PXDer}$ comprises the approximation of the time derivative, $\{h(k)\}$ are coefficients of the approximation of derivative operator and Ts is a sampling period of the measurement sample of voltage and current values.

Optionally, the apparatus is configured to provide the approximation of the derivative of $i_{PX}$ at sample time n and said remaining line fault parameters $u_P$, $i_{PR}$, and $i_{P0}$ with a time delay relative to time n based on the order of the approximation M, the time delay comprising M/2 for determination of the set of phasors.

Optionally, the apparatus is configured to determine a phase-to-ground fault and provide for definition of line fault parameters;

$u_P$ as a voltage measurement of the faulty phase;

$i_{PR}$ as a current measurement of the faulty phase plus $K_R(\Sigma i_{MP})$ where $\Sigma i_{MP}$ equals the sum of each of the instantaneous current measurement of the phases of the multi-phase power transmission medium and $K_R$ comprises a resistance based line coefficient; where $K_R = (R_0-R_1)/3R_1$, and $R_0$ is zero-sequence resistance per length of the line, $R_1$ is the positive-sequence resistance per length of the line.

$i_{PX}$ as a current measurement of the faulty phase plus $K_X(\Sigma i_{MP})$ where $\Sigma i_{MP}$ equals the sum of each of the instantaneous current measurement of the phases of the multi-phase power transmission medium and $K_X$ comprises a reactance based line coefficient; where $K_X = (X_0-X_1)/3X_1$, and $X_0$ is zero-sequence reactance per length of the line, $X_1$ is positive sequence reactance per length of the line.

$i_{P0}$ as the sum of the instantaneous current measurements of each of the phases of the multi-phase power transmission medium.

Optionally, the apparatus is configured to perform the Fourier transformation of the line fault parameters using the following equations;

$$\dot{U}_P(n) = \frac{2}{N} \sum_{k=1}^{N} u_P\left(n - \frac{M}{2} - N + k\right) \exp\left(\frac{2\pi k}{N}\right)$$

$$\dot{I}_{PR}(n) = \frac{2}{N} \sum_{k=1}^{N} i_{PR}\left(n - \frac{M}{2} - N + k\right) \exp\left(\frac{2\pi k}{N}\right)$$

$$\dot{I}_{PX}(n) = \frac{2}{N} \sum_{k=1}^{N} i_{PXDer}(n - N + k) \exp\left(\frac{2\pi k}{N}\right)$$

$$\dot{I}_{P0}(n) = \frac{2}{N} \sum_{k=1}^{N} i_{P0}\left(n - \frac{M}{2} - N + k\right) \exp\left(\frac{2\pi k}{N}\right)$$

where N is number of samples per cycle of fundamental frequency.

Optionally, the apparatus is configured to;

determine the fault location distance for the single-phase-to-ground fault using the equation;

$$D_F = \frac{imag[\dot{U}_P \bar{I}_{P0}]}{imag\left[\left(R_1 \dot{I}_{PR} + \frac{X_1}{\omega_0} \dot{I}_{PX}\right) \bar{I}_{P0}\right]}$$

where $D_F$ is the fault location distance and $\bar{I}_{P0}$ is the conjugate of $\dot{I}_{P0}$.

Optionally, the apparatus is configured to determine a phase-to-phase fault (including phase-to-phase-to ground fault) and provide for definition of the line fault parameters;

$u_P$ as a difference between the voltage measurements of the two faulty phases;

$i_{PR}$ as a difference between current measurements of the two faulty phases;

$i_{PX}$ as a difference between current measurements of the two faulty phases;

$i_{P0}$ as the sum of the instantaneous current measurements of each of the phases of the multi-phase power transmission medium.

Optionally, the apparatus is configured to perform the Fourier transformation of the line fault parameters using the following equations;

$$\dot{U}_P(n) = \frac{2}{N} \sum_{k=1}^{N} u_P\left(n - \frac{M}{2} - N + k\right) \exp\left(\frac{2\pi k}{N}\right)$$

$$\dot{I}_{PR}(n) = \frac{2}{N} \sum_{k=1}^{N} i_{PR}\left(n - \frac{M}{2} - N + k\right) \exp\left(\frac{2\pi k}{N}\right)$$

$$\dot{I}_{PX}(n) = \frac{2}{N} \sum_{k=1}^{N} i_{PXDer}(n - N + k) \exp\left(\frac{2\pi k}{N}\right)$$

$$\dot{I}_{P0}(n) = \frac{2}{N} \sum_{k=1}^{N} i_{P0}\left(n - \frac{M}{2} - N + k\right) \exp\left(\frac{2\pi k}{N}\right)$$

where N is number of samples per cycle of fundamental frequency.

Optionally, the apparatus is configured to;

determine the fault location distance $D_F$ for the phase-to-phase fault using the equation;

$$D_F = \frac{imag[\dot{U}_P]}{imag\left[R_1 \dot{I}_{PR} + \frac{X_1}{\omega_0} \dot{I}_{PX}\right]}$$

where the function imag[y] defines taking the imaginary part of the term y.

Optionally, the operating voltage for distance protection is defined as;

$$\dot{U}_{op} = \dot{U}_P - \left[R_1 \dot{I}_{PR} + \frac{X_1}{\omega_0} \dot{I}_{PX}\right] D_{set}$$

where $D_{set}$ is a setting distance for distance protection and $\dot{U}_{op}$ is a Fourier transform of an operating voltage.

If this operating voltage meets the following criterion, then the trip signal of distance protection will be picked up, that is, the fault is determined as an internal fault.

$$90^0 < \arg\frac{\dot{U}_P}{\dot{U}_{op}} < 270^0$$

According to a further aspect of the invention we provide a method for determining a fault location distance or distance protection in a multi-phase power transmission medium, the method comprising; determine a set of line fault parameters $u_p$, $i_{PR}$, $i_{PX}$ and $i_{P0}$ based on a measurement sample of voltage and current values at a measurement point for phases of a multi-phase current of said power transmission medium and a fault type, the set of line fault parameters determined at a plurality of sample times, n; determine a derivative with respect to time of one of the line fault parameters $i_{PX}$; determine a set of phasors $\dot{U}_p(n)$, $\dot{I}_{PR}(n)$, $\dot{I}_{PX}(n)$, $\dot{I}_{P0}(n)$ and using a Fourier transformation of the derivative and of the remaining line fault parameters at the plurality of sample times and use said set of phasors to determine a fault location distance or distance projection distance along the power transmission medium; wherein, the determination of the fault location distance or the distance protection distance is based on the line equation;

$$\dot{U}_P = \dot{U}_F + \left[R_1 \dot{I}_{PR} + \frac{X_1}{\omega_0} \dot{I}_{PX}\right] D_F$$

where $\dot{U}_P$, $\dot{I}_{PR}$ and $\dot{I}_{PX}$ comprise the Fourier transforms of the line fault parameters $u_p$, $i_{PR}$ and the derivative $i_{PX}$, $\dot{U}_F$ is a Fourier transform of the voltage at the fault location, $R_1$ is a positive sequence resistance of the power transmission medium per length (ohm/km), $D_F$ is the fault location distance, $X_1$ is a positive sequence reactance of the power transmission medium per length (ohm/km) and $\omega_0$ is the fundamental angular frequency where $\omega_0 = 2\pi f_0$ and $f_0$ is the fundamental frequency of the current of the power transmission medium.

The methods performed by the apparatus of the first aspect, defined as optional features above, may be applied as optional features to this further aspect.

BRIEF DESCRIPTION OF THE DRAWINGS

There now follows, by way of example only, a detailed description of embodiments of the invention with reference to the following figures, in which:

FIG. 1 shows a method illustrating example steps for determining a fault location and/or distance protection for a power transmission medium;

FIG. 2 shows an example three phase current as recorded by a distance relay along the power transmission medium during a fault condition which shows a decaying DC component;

DETAILED DESCRIPTION

Figure 3:
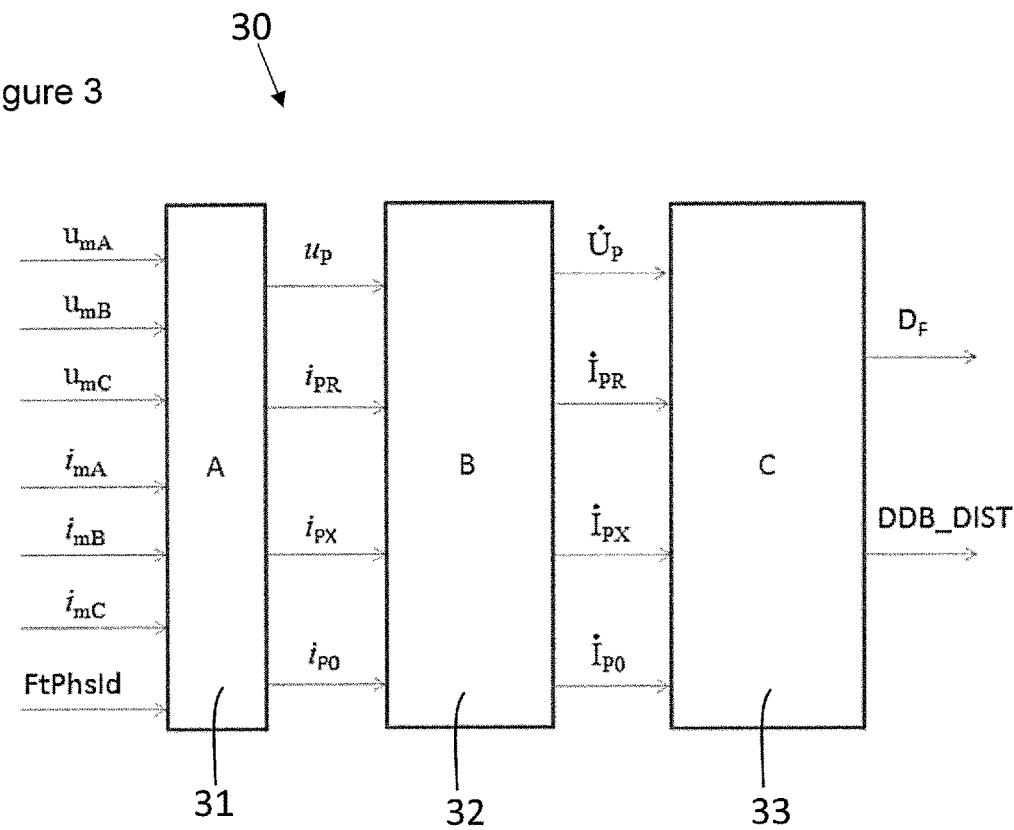
FIG. 3 shows an example apparatus for determination of fault location and/or distance protection.

Accurate calculation of a fault location from measurements is helpful for finding a fault point along a power transmission medium. Accurate determination of a fault location may reduce operating costs by avoiding expensive patrols as well as reducing revenue loss caused by long time outage. Distance protection comprises use of a protective relaying device in the power transmission medium which can clear a fault by sending a tripping order to a breaker provided that the fault occurs in a protective zone relative to the protective relaying device. Present techniques for fault location and distance protection can be inaccurate due to the fault-induced DC offset components in measured voltage and current.

It has been found that impedance based fault location determination may be inaccurate due to the presence of decaying DC components present in voltage and current measurements made by fault location apparatus during determination of the fault location. The following examples provide for an apparatus and method which utilises a derivative of the measured current which can take account of the decaying DC component that may occur during a phase to ground, phase to phase, phase to phase to ground fault.

FIG. 1 shows an example method of fault location, which may also be used for distance protection. The method uses, at step 10, a plurality of instantaneous voltage and current measurements taken at a measurement point along a power transmission medium, such as a power line. The measurement point may be the location of a fault detection apparatus or it may be a measurement point from which measurements can be taken. For a multi-phase power transmission medium, the voltage and current measurements may be acquired for each phase. The measurements may be sampled in real time, that is, the measurements are continuously measured and recorded for fault location or distance protection. The sampling rate may be, for example, 24 samples per cycle (a cycle of fundamental frequency may be 50 Hz or 60 Hz), 16 samples per cycle or 12 samples per cycle. It will be appreciated that other sampling frequencies may be used. The following description describes a three phase power transmission medium, but other numbers of phase could be used.

The notification of a fault condition is shown at step 11. The identification of fault condition of the line may be performed by a different apparatus. Thus the present apparatus may receive a notification signal indicative of the fault condition. Step 11 comprises determining a set of line fault parameters based on the plurality of instantaneous voltage and current measurements and the fault condition. The fault condition may be indicative of which phase or phases are experiencing a fault condition. The fault condition may identify at least one phase that is experiencing a phase-to-ground fault, identifying which phases are experiencing a phase-to-phase fault or a phase-to-phase-to-ground fault, and whether three or more phases are experiencing a fault (e.g. a three phase fault for a three phase system).

Determining a differential of one of the prepared current values with respect to time or, in particular, an approximation of a differential with respect to time of one of the line fault parameters is shown at step 12. The taking of the differential has been found to provide for accurate determination of a fault location distance or a distance protection distance despite the presence of a decaying DC component with a line equation as described below.

Step 13 shows the determination of a Fourier transform of the differential obtained at step 12 and the remaining line fault parameters from step 11. The remaining line fault parameters provided for Fourier transformation may be time delayed relative to the differential by a time delay value. The time delay value may be based on a parameter of the approximation of the differential operator used in step 12. The Fourier transform has been found to reduce the effect of high frequency noise in the subsequent fault location and distance protection calculations. The output of step 13 comprises a set of vectors or phasors based on the approximated differential of one of the line fault parameters and based on the remaining line fault parameters.

The calculation of the location of the fault or a distance protection distance is performed at step 14 based on the output of the Fourier transform step 13.

FIG. 2 shows an example current signature recorded by a relay. There is a significant decaying DC offset component superposed on the fault current 20 (in current of phase C of a three phase system). In this example, the fault resistance is nearly zero (0.01Ω) and the fault distance from the relay is 35 km. As an example, it has been found that prior methods that do not take account of the decaying DC offset can result in the fault location, by known impedance-based methods, being calculated as 32.31 km. Thus, this comprises a relative error of up to 5.37%, which is in excess of what many power transmission medium operators expect. Additionally, the DC offset component has a significant impact on distance protection, especially for the simultaneous Zone I of distance protection.

FIG. 3 shows an apparatus 30 configured for fault location determination and/or distance protection. The apparatus 30 may form part of a fault detection module arranged in association with a power transmission medium, such as a power line. The apparatus may be remote from the power transmission medium and configured to receive voltage and current measurements from said power transmission medium. The apparatus comprises a pre-processing block 31 configured to (optionally) identify a fault in a power transmission medium or a phase of a power transmission medium. The pre-processing block uses measurements of instantaneous voltage and current from each of the phases (for a multi-phase power transmission medium) and using a comparison between the measurements of the different phases and with predetermined values, determines a faulty phase.

The pre-processing block 31 determines a set of line fault parameters $u_P$, $i_{PR}$, $i_{PX}$ and $i_{P0}$ based on said voltage and current measurements and the fault condition.

The apparatus 30 further comprises a measurement processing block 32 for deriving vectors or phasors from the line fault parameters ($u_P$, $i_{PR}$, $i_{PX}$, $i_{P0}$) by applying a Fourier transform as described below.

The apparatus further comprises a fault location/distance protection determination block 33 configured to use said phasors to determine a fault location distance ($D_F$) and/or a distance protection distance (DDB_DIST).

Thus, the apparatus 30 is configured to, based on a measurement sample of voltage and current values at a measurement point, determine, a set of line fault parameters. Then, at block 32, determine an approximation of a differential with respect to time of one of the current based line fault parameters (and in particular an inductive current based line fault parameter) and determine the remaining line fault parameters at a time related to the approximation. Further, at block 32, determine a Fourier transformation, which results in phasors $\dot{U}_P$, $\dot{I}_{PR}$, $\dot{I}_{PX}$, $\dot{I}_{P0}$, and use said Fourier transformed values, at block 33, to determine a fault location distance or distance projection along the power transmission medium.

The pre-processing block 31 is configured to receive an instantaneous voltage measurement, $U_m$, and an instantaneous current measurement, $i_m$, from each phase of the power transmission medium. Thus, for a three phase arrangement with phases A, B and C, the block 31 is configured to receive the voltage and current measurements $u_{mA}$ and $i_{mA}$ for phase A, $u_{mB}$ and $i_{mB}$ for phase B and $u_{mC}$ and $i_{mC}$ for phase C. The block 31 receives a faulty phase detection signal, FtPhsld, from a faulty phase detector. Thus, in one example, the preprocessing block 31 may be configured to be informed of the faulty phase by way of signal FtPhsld, which is received from a faulty phase detector, and provide an appropriate set of line fault parameters derived from the measurements to the block 32.

The preprocessing block 31 is configured to determine four parameters, termed "line fault parameters", from the instantaneous phase voltage and current measurements; $\dot{U}_P$, $\dot{I}_{PR}$, $\dot{I}_{PX}$, $\dot{I}_{P0}$. $\dot{U}_P$ may be representative of voltage of the faulty phase. $\dot{I}_{PR}$ may be representative of a resistive part of the faulty phase current. $\dot{I}_{PX}$ may be representative of an inductive part of the faulty phase current. $\dot{I}_{P0}$ may be representative of zero-sequence current. There are mutual resistances (earth resistance) and mutual inductances between the three phase conductors of the power transmission line. For an un-symmetrical fault, one phase voltage is related to not only the corresponding phase of current but to all the other two phase currents and the line fault parameters are selected to provide for determination of such a condition.

In this example, the preprocessing block receives the fault identification signal FtPhsld and is configured to assign the four parameters as follows:

a) If it is phase A to ground fault (if FtPhsld==1):

$u_P = u_{mA}$ $i_{PR} = i_{mA} K_R (i_{mA} + i_{mB} + i_{mC})$ $i_{PX} = i_{mA} + K_X (i_{mA} + i_{mB} + i_{mC})$ $i_{P0} = i_{mA} + i_{mB} + i_{mC}$ b) If it is phase B to ground fault (if FtPhsld==2):

$u_P = u_{mB}$ $i_{PR} = i_{mB} + K_R (i_{mA} + i_{mB} + i_{mC})$ $i_{PX} = i_{mB} + K_X (i_{mA} + i_{mB} + i_{mC})$ $i_{P0} = i_{mA} + i_{mB} + i_{mC}$ c) If it is phase C to ground fault (if FtPhsld==3):

$u_P = u_{mC}$ $i_{PR} = i_{mC} + K_R (i_{mA} + i_{mB} + i_{mC})$ $i_{PX} = i_{mC} + K_X (i_{mA} + i_{mB} + i_{mC})$ $i_{P0} = i_{mA} + i_{mB} + i_{mC}$ d) If it is phase A to phase B fault, or phase A to phase B to ground fault (if FtPhsld==4):

$u_P = u_{mA} - u_{mB}$ $i_{PR} = i_{mA} - i_{mB}$ $i_{PX} = i_{mA} - i_{mB}$ $i_{P0} = i_{mA} + i_{mB} + i_{mC}$ e) If it is phase B to phase C fault, or phase B to phase C to ground fault (if FtPhsld==5)

$u_P = u_{mB} - u_{mC}$ $i_{PR} = i_{mB} - i_{mC}$ $i_{PX} = i_{mB} - i_{mC}$ $i_{P0} = i_{mA} + i_{mB} + i_{mC}$ f) If it is phase C to phase A fault, or phase C to phase A to ground fault (if FtPhsId==6)

$u_P = u_{mC} - u_{mA}$ $i_{PR} = i_{mC} - i_{mA}$ $i_{PX} = i_{mC} - i_{mA}$ $i_{P0} = i_{mA} + i_{mB} + i_{mC}$ g) If it is three-phase fault (if FtPhsId==7)

$u_P = u_{mB} - u_{mC}$ $i_{PR} = i_{mB} - i_{mC}$ $i_{PX} = i_{mB} - i_{mC}$ $i_{P0} = i_{mA} + i_{mB} + i_{mC}$

Where $$K_R = \frac{R_0 - R_1}{3R_1}$$

is the first line coefficient, which is calculated by zero-sequence resistance per length (real part "$R_0$" of zero-sequence impedance per length $Z_0$ ohm/km) and positive sequence resistance per length (real part "R," of positive-sequence impedance $z_1$, ohm/km) of the power transmission medium or line. It will be appreciated that the first line coefficient is a parameter of the power transmission medium that the apparatus 30 is configured to operate on and will therefore be provided to the apparatus 30 as a predetermined value.

$$K_X = \frac{X_0 - X_1}{3X_1}$$

is the second line coefficient, which is calculated by zero-sequence reactance per length (imaginary part "$X_0$" of zero-sequence impedance $Z_0$, ohm/km) and positive sequence reactance per length (imaginary part "$X_1$" of positive-sequence impedance $z_1$, ohm/km) of the power transmission medium or line. It will be appreciated that the second line coefficient is a parameter of the power transmission medium that the apparatus 30 is configured to operate on and will therefore be provided to the apparatus 30 as a predetermined value.

While phases B and C are used for the three phase fault type, it will be appreciated that the line fault parameters $u_P$, $i_{PR}$ and $i_{PX}$ may comprise the difference between phase B and phase C, phase C and phase A, or phase A and phase B.

The apparatus may receive the fault type from the fault detector and determine the line fault parameters to measure. Alternatively, it may measure and/or calculate a plurality of line fault parameters, voltages or currents and on determination of a fault type, select the appropriate line fault parameters.

Figure 4:
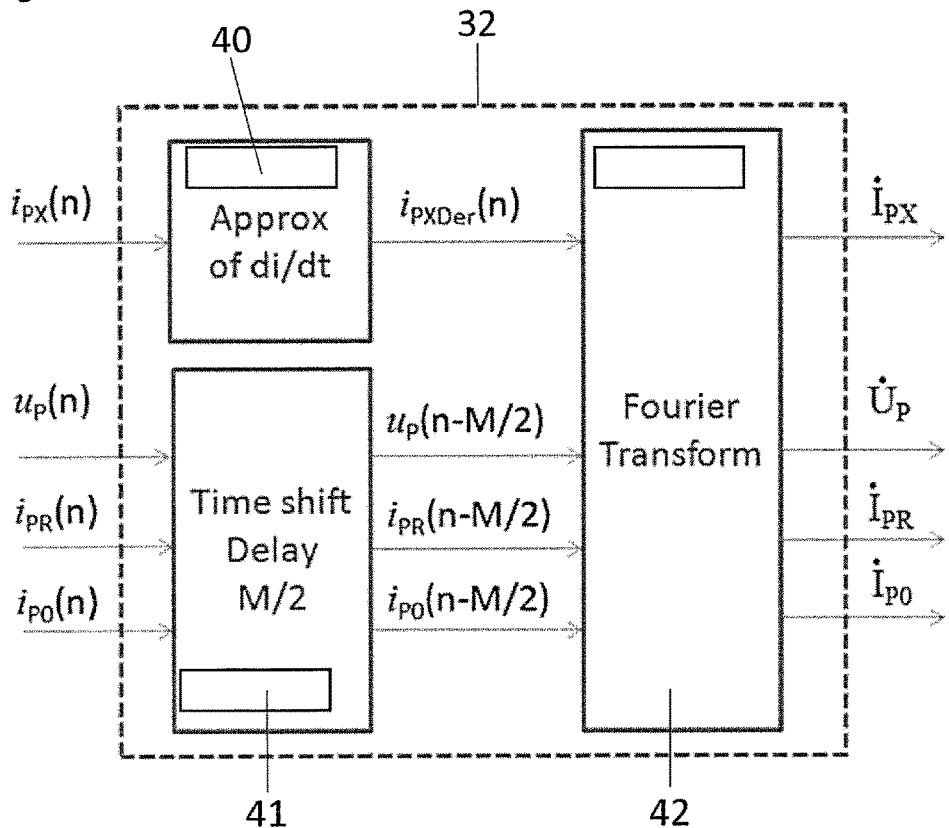
FIG. 4 shows a more detailed view of a component of FIG. 3 for determination of a Fourier transform.

FIG. 4 shows a more detailed view of the measurement processing block 32. The block 32 is configured to receive the four line fault parameters at each sample time instance, n. The output of block 32 comprises four phasors (or phase vectors) that have been transformed by a Fourier transform. The block 32 includes a derivative approximation block 40, a time shift block 41 and a Fourier transform block 42.

The differential approximation block 40 is configured to calculate an approximation of the derivative function of current $i_{PX}$, which comprises one of the line fault parameters that is based in the current measurements of the phases (that is, $$\frac{di_{PX}}{dt},$$

which is notated as $i_{PXDer}$) by the following equation:

$$i_{PXDer}(n) = \frac{1}{T_s} \sum_{k=0}^{M} h(k) i_{PX}(n-k)$$

Where $\{h(k)\}$ are coefficients of the approximation of derivative operator, M is the order of the approximation and Ts is sampling period of the block 31. The coefficients of the approximation are predetermined based on the projection of the derivative operator on a scale function basis, for example, the Daubechies scale function, at a predetermined resolution.

With these coefficients, the derivative operator can be efficiently and precisely approximated by convolution of these coefficients with the signal that is derived. The order, M, is selected based on the accuracy required. The order corresponds to the number of $i_{PX}$ samples used in the approximation of the derivative function.

For example, for M=1, h(k)={1,−1}, the approximation of the derivative operator to $i_{PX}$ is:

$i_{PXDer}(n) = [i_{PX}(n) - i_{PX}(n-1)]/T_s$

In order to obtain a higher accuracy of approximation, for example a 4-order approximation, which is based on the Daubechies orthogonal basis, then, optionally, M=4, h(k)={−0.0833, 0.6667, 0, −0.6667, 0.0833}.

The time shift block 41 is configured to receive a subset of the line fault parameters, $u_P$, $i_{PX}$, and $i_{P0}$. The block 41 is configured to time delay the subset of parameters by M/2. This is because the approximation of the derivative has M/2 time shift and the time delay is selected to correspond to the time shift of the derivative operator. The function of block 41 is to compensate such time shift. Thus, the approximation of the differential of $i_{PX}$ at sample time n and the remaining line fault parameters at sample time n−M/2 is provided to the Fourier transform block 42.

Thus, providing;

$u_P(n-M/2)$ $i_{PR}(n-M/2)$ $i_{P0}(n-M/2)$

If M/2 is not an integer, then a linear interpolation may be employed:

$u_P(n-M/2) = [u_P(n) + u_P(n-M)]/2$ $i_{PR}(n-M/2) = [i_{PR}(n) + i_{PR}(n-M)]/2$ $i_{P0}(n-M/2) = [i_{P0}(n) + i_{P0}(n-M)]/2$

For example, if M=1:

$u_P(n-½) = [u_P(n) + u_P(n-1)]/2$ $i_{PR}(n-½) = [i_{PR}(n) + i_{PR}(n-1)]/2$ $i_{p0}(n-½) = [i_{p0}(n) + i_{p0}(n-1)]/2$

The Fourier transform block 42 receives;

$u_P(n-M/2)$, $i_{PR}(n-M/2)$, and $i_{P0}(n-M/2)$ from the block 41 as well as the $i_{PXDer}(n)$ from the derivative approximation block 40.

The Fourier transform is determined using the following equations:

$$\dot{U}_P(n) = \frac{2}{N}\sum_{k=1}^{N} u_P\left(n - \frac{M}{2} - N + k\right)\exp\left(\frac{2\pi k}{N}\right)$$

$$\dot{I}_{PR}(n) = \frac{2}{N}\sum_{k=1}^{N} i_{PR}\left(n - \frac{M}{2} - N + k\right)\exp\left(\frac{2\pi k}{N}\right)$$

$$\dot{I}_{PX}(n) = \frac{2}{N}\sum_{k=1}^{N} i_{PXDer}(n - N + k)\exp\left(\frac{2\pi k}{N}\right)$$

$$\dot{I}_{P0}(n) = \frac{2}{N}\sum_{k=1}^{N} i_{P0}\left(n - \frac{M}{2} - N + k\right)\exp\left(\frac{2\pi k}{N}\right)$$

where N is samples per cycle of fundamental frequency, for example, for a 50 Hz system, N can be selected as 16 samples per 0.02 s.

The Fourier transform block 42, by way of application of the Fourier transform, may be configured to filter high order harmonics.

The measurement processing block 32 is configured to pass the Fourier transformed terms or phasors $\dot{U}_P(n)$, $\dot{I}_{PR}(n)$, $\dot{I}_{PX}(n)$, and $\dot{I}_{P0}(n)$ to the fault location/distance protection determination block 33.

The fault location/distance protection determination block 33 performs its calculation for fault location and/or distance protection based on one or more of the phasors received from the block 32 and the line equation shown below, in which the derivative of current has already been approximated by convolution with coefficients of a derivative operator:

$$\dot{U}_P = \dot{U}_F + \left[R_1 \dot{I}_{PR} + \frac{X_1}{\omega_0} \dot{I}_{PX}\right] D_F$$

where $R_1$ is positive sequence resistance of line per length (ohm/km); $X_1$ is a positive sequence reactance per length of line (ohm/km); $U_F$ is the voltage of the fault point on the line; $\omega_0 = 2\pi f$ where f is the line frequency and $D_F$ is fault distance in kilometers from the measurement point.

For fault location the block 33 is configured to determine the following equations depending on the type of fault, which may be determined from the indicator FtPhsld. Signaling may be provided from the preprocessing block 31 indicative of the type of fault or, alternatively, signaling may be provided from a separate faulty phase detector.

If the fault is a phase-to-phase fault (including phase-to-phase-to-ground fault) or three-phase fault, the fault distance is located by the following equation:

$$D_F = \frac{imag[\dot{U}_P]}{imag\left[R_1 \dot{I}_{PR} + \frac{X_1}{\omega_0} \dot{I}_{PX}\right]}$$

where "imag" means taking the imaginary part. It will be appreciated that $\dot{U}_F$ is excluded from the imaginary part because the fault resistance is always resistive.

If the fault is a phase-to-ground fault, the fault distance is given by:

$$D_F = \frac{imag[\dot{U}_P \bar{I}_{P0}]}{imag\left[\left(R_1 \dot{I}_{PR} + \frac{X_1}{\omega_0} \dot{I}_{PX}\right)\bar{I}_{P0}\right]}$$

where $\bar{I}_{P0}$ is the conjugate of $\dot{I}_{P0}$.

For distance protection, the block 33 defines the operating voltage $\dot{U}_{op}$ Fourier transform of the operating voltage) by the following equation:

$$\dot{U}_{op} = \dot{U}_P - \left[R_1 \dot{I}_{PR} + \frac{X_1}{\omega_0} \dot{I}_{PX}\right] D_{set}$$

where $D_{set}$ is setting distance. Thus this provides information for a distance protection relay device which may be configured to compare the operating voltage with the measured voltage. If they are in opposite direction, then it will be determined as an internal fault. Otherwise an external fault will be determined. Once the internal fault is detected, a trip signal may be generated and subsequently trigger a breaker to open the circuit.

Thus, the output of the block 33 is a fault location distance providing a distance to the fault from the measurement point or a distance $D_{set}$ for use in distance protection.

Additionally, a trip pickup parameter can be determined by the following criterion:

$$\frac{\pi}{2} < \arg\frac{\dot{U}_P}{\dot{U}_{op}} < \frac{3\pi}{2}$$

If the comparison of operating voltage with measured voltage meets the above criterion, the trip signal will be picked up and subsequently trigger a breaker to open the circuit to clear the fault.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An apparatus for determining a fault location distance or a distance for distance protection in a multi-phase power transmission medium, the apparatus configured to;

determine a set of line fault parameters $u_p$, $i_{PR}$, $i_{PX}$ and $i_{P0}$ based on a measurement sample of voltage and current values at a measurement point for phases of a multi-phase current of said power transmission medium and a fault type, the set of line fault parameters determined at a plurality of sample times, n;

determine a derivative with respect to time of one of the line fault parameters $i_{PX}$ representative of an inductive part of measured faulty phase current;

determine a set of phasors $\dot{U}_P(n)$, $\dot{I}_{PR}(n)$, $\dot{I}_{PX}(n)$, and $\dot{I}_{P0}(n)$, using a Fourier transformation of the derivative and of the remaining line fault parameters at the plurality of sample times and use said set of phasors to determine a fault location distance or distance projection distance along the power transmission medium;

wherein, the determination of the fault location distance or the distance protection distance is based on the line equation;

$$\dot{U}_P = \dot{U}_F + \left[R_1 \dot{I}_{PR} + \frac{X_1}{\omega_0} \dot{I}_{PX}\right] D_F$$

where $\dot{U}_P$, $\dot{I}_{PR}$, and $\dot{I}_{PX}$ comprise the Fourier transforms of the line fault parameters $u_p$, $i_{PR}$ and the derivative $i_{PX}$, $\dot{U}_F$ is a Fourier transform of the voltage at the fault location, $R_1$ is a positive sequence resistance of the power transmission medium per length (ohm/km), $D_F$ is the fault location distance, $X_1$ is a positive sequence reactance of the power transmission medium per length (ohm/km) and $\omega_0$ is the fundamental angular frequency where $\omega_0 = 2\pi f_0$ and $f_0$ is the fundamental frequency of the current of the power transmission medium; and clearing a fault by tripping a breaker adjacent to a protective zone determined based at least in part on the determination of the fault location distance or the distance protection distance.

2. The apparatus according to claim 1, wherein the apparatus is configured to;

determine a fault location distance for one or more of the following fault conditions or for distance protection;

i) a phase-to-phase fault and/or phase-to-phase-to-ground fault and/or three-phase fault in which;

$$D_F = \frac{imag[\dot{U}_P]}{imag\left[R_1 I_{PR} + \frac{X_1}{\omega_0} I_{PX}\right]}$$

where the function imag[y] defines taking the imaginary part of the term y;

ii) a single-phase-to-ground fault in which;

$$D_F = \frac{imag[\dot{U}_P \overline{I}_{P0}]}{imag\left[\left(R_1 I_{PR} + \frac{X_1}{\omega_0} I_{PX}\right) \overline{I}_{P0}\right]}$$

where $\overline{I}_{P0}$ is the conjugate of $\dot{I}_{P0}$; and iii) distance protection, in which;

$$\dot{U}_{op} = \dot{U}_P - \left[R_1 \dot{I}_{PR} + \frac{X_1}{\omega_0} \dot{I}_{PX}\right] D_{set}$$

where $D_{set}$ is a distance protection distance and $\dot{U}_{op}$ is a Fourier transform of an operating voltage wherein when the operating voltage meets the following criterion:

$$\frac{\pi}{2} < \arg \frac{\dot{U}_P}{\dot{U}_{op}} < \frac{3\pi}{2}$$

an internal fault will be determined.

3. The apparatus according to claim 1, in which the apparatus is configured to determine a fault location distance for one or more of the following fault types;
a first phase of a multi-phase to ground fault;
a second phase of a multi-phase to ground fault;
a third phase of a multi-phase to ground fault;
a first phase to second phase fault;
a second phase to third phase fault;
a third phase to first phase fault;
a first phase to second phase to ground fault;
a second phase to third phase to ground fault;
a third phase to first phase to ground fault;
a three phase fault of a three phase power transmission medium.

4. The apparatus according to claim 1, in which the apparatus is configured to determine an approximation of a derivative with respect to time.

5. The apparatus according to claim 4, in which the apparatus is configured to determine the Fourier transforms based on;
the approximation of the derivative of $i_{PX}$ with respect to time at a sample time n; and
the remaining line fault parameters $u_P$, $i_{PR}$ and $i_{PR}$ at a sample time delayed relative to n, the delay based in the approximation.

6. The apparatus according to claim 4, in which the apparatus is configured to determine an approximation of said derivative with respect to time of one of the line parameters $i_{PX}$ wherein the approximation is made using a number M of sample sets n by;

$$i_{PXDer(n)} = \frac{1}{T_s} \sum_{k=0}^{M} h(k) i_{PX}(n-k)$$

Where $i_{PXDer}$ comprises the approximation of the time derivative, $\{h(k)\}$ are coefficients of the approximation of derivative operator and $T_s$ is a sampling period of the measurement sample of voltage and current values.

7. The apparatus according to claim 6, in which the apparatus is configured to provide the approximation of the derivative of $i_{PX}$ at sample time n and said remaining line fault parameters $u_P$, $i_{PR}$ and $i_{P0}$ with a time delay relative to time n based on the order of the approximation M, the time delay comprising M/2 for determination of the set of phasors.

8. The apparatus according to claim 1, in which the apparatus is configured to determine a phase-to-ground fault and provide for definition of line fault parameters;
$u_P$ as a voltage measurement of the faulty phase;
$i_{PR}$ as a current measurement of the faulty phase plus $K_R(\Sigma i_{MP})$ where $\Sigma i_{MP}$ equals the sum of each of the instantaneous current measurement of the phases of the multi-phase power transmission medium and KR comprises a resistance based line coefficient;

$i_{PR}$ as a current measurement of the faulty phase plus $K_R(\Sigma i_{MP})$ where $\Sigma i_{MP}$ equals the sum of each of the instantaneous current measurement of the phases of the multi-phase power transmission medium and $K_X$ comprises a reactance based line coefficient;

$i_{P0}$ as the sum of the instantaneous current measurements of each of the phases of the multi-phase power transmission medium.

9. The apparatus according to claim 1, wherein the apparatus is configured to perform the Fourier transformation of the line fault parameters using the following equations;

$$\dot{U}_P(n) = \frac{2}{N}\sum_{k=1}^{N} u_P\left(n - \frac{M}{2} - N + k\right)\exp\left(\frac{2\pi k}{N}\right)$$

$$\dot{I}_P(n) = \frac{2}{N}\sum_{k=1}^{N} i_{PR}\left(n - \frac{M}{2} - N + k\right)\exp\left(\frac{2\pi k}{N}\right)$$

$$\dot{I}_{PX}(n) = \frac{2}{N}\sum_{k=1}^{N} i_{PXDer}(n - N + k)\exp\left(\frac{2\pi k}{N}\right)$$

$$\dot{I}_{P0}(n) = \frac{2}{N}\sum_{k=1}^{N} i_{P0}\left(n - \frac{M}{2} - N + k\right)\exp\left(\frac{2\pi k}{N}\right)$$

where N is number of samples per cycle of fundamental frequency.

10. The apparatus according to claim 1, wherein the apparatus is configured to;
determine the fault location distance for the single-phase-to-ground fault using the equation;

$$D_F = \frac{imag[\dot{U}_P \bar{I}_{P0}]}{imag\left[\left(R_1 \dot{I}_{PR} + \frac{X_1}{\omega_0}\dot{I}_{PX}\right)\bar{I}_{P0}\right]}$$

where $D_F$ is the fault location distance and $\bar{I}_{P0}$ is the conjugate of $\dot{I}_{P0}$.

11. The apparatus according to claim 1, in which the apparatus is configured to determine a phase-to-phase fault and provide for definition of the line fault parameters;
$u_P$ as a difference between the voltage measurements of the two faulty phases;
$i_{PR}$ as a difference between current measurements of the two faulty phases;
$i_{PX}$ as a difference between current measurements of the two faulty phases;
$i_{P0}$ as the sum of the instantaneous current measurements of each of the phases of the multi-phase power transmission medium.

12. The apparatus according to claim 11, wherein the apparatus is configured to perform the Fourier transformation of the line fault parameters using the following equations;

$$\dot{U}_P(n) = \frac{2}{N}\sum_{k=1}^{N} u_P\left(n - \frac{M}{2} - N + k\right)\exp\left(\frac{2\pi k}{N}\right)$$

$$\dot{I}_P(n) = \frac{2}{N}\sum_{k=1}^{N} i_{PR}\left(n - \frac{M}{2} - N + k\right)\exp\left(\frac{2\pi k}{N}\right)$$

-continued $$\dot{I}_{PX}(n) = \frac{2}{N}\sum_{k=1}^{N} i_{PXDer}\left(n - \frac{M}{2} - N + k\right)\exp\left(\frac{2\pi k}{N}\right)$$

$$\dot{I}_{P0}(n) = \frac{2}{N}\sum_{k=1}^{N} i_{P0}\left(n - \frac{M}{2} - N + k\right)\exp\left(\frac{2\pi k}{N}\right)$$

where N is number of samples per cycle of fundamental frequency.

13. The apparatus according to claim 12, wherein the apparatus is configured to;
determine the fault location distance DF for the phase-to-phase fault using the equation;

$$D_F = \frac{imag[\dot{U}_P]}{imag\left[R_1 \dot{I}_{PR} + \frac{X_1}{\omega_0}\dot{I}_{PX}\right]}$$

where the function imag[y] defines taking the imaginary part of the term y.

14. A method for determining a fault location distance or distance protection in a multi-phase power transmission medium, the method comprising;
determine a set of line fault parameters $u_P$, $i_{PR}$ and $i_{P0}$ based on a measurement sample of voltage and current values at a measurement point for phases of a multi-phase current of said power transmission medium and a fault type, the set of line fault parameters determined at a plurality of sample times, n;
determine a derivative with respect to time of one of the line fault parameters $i_{PX}$;
determine a set of phasors $\dot{U}_P(n)$, $\dot{I}_{PR}(n)$, $\dot{I}_{PX}(n)$ and $\dot{I}_{P0}(n)$ using a Fourier transformation of the derivative and of the remaining line fault parameters at the plurality of sample times and use said set of phasors to determine a fault location distance or distance projection distance along the power transmission medium;
wherein, the determination of the fault location distance or the distance protection distance is based on the line equation;

$$\dot{U}_P = \dot{U}_F + \left[R_1 \dot{I}_{PR} + \frac{X_1}{\omega_0}\dot{I}_{PX}\right]D_F$$

where $\dot{U}_P$, $\dot{I}_{PR}$, and $\dot{I}_{PX}$ comprise the Fourier transforms of the line fault parameters $u_P$, $i_{PR}$ and the derivative $\dot{I}_{PX}$, $\dot{U}_F$ is a Fourier transform of the voltage at the fault location, $R_1$ is a positive sequence resistance of the power transmission medium per length (ohm/km), $D_F$ is the fault location distance, $X_1$ is a positive sequence reactance of the power transmission medium per length (ohm/km) and $\omega_0$ is the fundamental angular frequency where $\omega_0=2\pi f_0$ and $f_0$ is the fundamental frequency of the current of the power transmission medium; and
clearing a fault by tripping a breaker adjacent to a protective zone determined based at least in part on the determination of the fault location distance or the distance protection distance.

* * * * *